United States Patent [19]

Noguchi et al.

[11] Patent Number: 5,225,790

[45] Date of Patent: Jul. 6, 1993

[54] TUNABLE WIDEBAND ACTIVE FILTER

[75] Inventors: Robert Y. Noguchi; Joseph M. Rinaldis, both of Colorado Springs; Paul Esling, Monument, all of Colo.

[73] Assignee: Digital Equipment Corporation, Maynard, Mass.

[21] Appl. No.: 843,730

[22] Filed: Feb. 28, 1992

[51] Int. Cl.⁵ .......................... H03F 3/45; H03F 3/191
[52] U.S. Cl. .................................. 330/260; 330/303; 330/306
[58] Field of Search ............... 330/252, 260, 289, 291, 330/292, 302, 303, 306, 256, 254; 307/494

[56] References Cited

U.S. PATENT DOCUMENTS

| | | | |
|---|---|---|---|
| 4,288,754 | 9/1981 | Okada et al. | 330/260 |
| 4,381,487 | 4/1983 | Erickson | 330/306 |
| 4,598,256 | 7/1986 | Kinkel | 330/303 X |
| 5,012,201 | 4/1991 | Morita et al. | 330/252 |

*Primary Examiner*—Steven Mottola
*Attorney, Agent, or Firm*—Arnold, White & Durkee

[57] ABSTRACT

A wideband tunable (programmable) filter includes first-order and second-order filter circuits employing bipolar transistors. The bandwidth of the filter circuits are set by the product of the dynamic emitter resistance of the transistors and directly coupled on-chip capacitances. The filter bandwidth is inversely proportional to the time constant. To adjust the resonant frequency of the filter networks, emitter currents are varied, which in turn controls the emitter resistances. As the resonant frequency of the filter network is varied, the gain and normalized frequency response of the various output nodes remain constant. In the second-order configuration, the damping ratio of the filter is set using "positive" feedback, for a Q of greater than one-half, with a loop gain of less than one. Temperature compensation is accomplished by use of a temperature "dependent" voltage network. The output of this network provides the sum of the continuous temperature compensating voltage component and the externally controlled tuning voltage for the resonant frequency. This voltage is converted to currents that control the bandwidth of the filter so as to minimize dependence of the resonant frequency upon temperature.

20 Claims, 6 Drawing Sheets

TUNABLE WIDEBAND ACTIVE FILTER

FIELD OF THE INVENTION

The present invention relates generally to signal filters, and more particularly, to signal-filter circuits which are tunable over a wide frequency band.

BACKGROUND OF THE INVENTION

For some time now, wideband analog active filters have been synthesized by placing integrators in the forward filter path and modifying coefficients of the denominator polynomial, using negative feedback circuitry which is summed at the input of the filter. To synthesize a multi-pole filter network, first and/or second-order modular block filter networks have been cascaded to obtain the desired overall filter order.

As illustrated in FIG. 1a, it is well known to construct second-order filters 100 by cascading two integrators 110 and 112 with each output fedback to the originating input via separate paths 114 and 116, each with its own scale factor. Each of the integrator circuits 110 and 112 typically consists of a Gilbert cell with a capacitor output load.

The gain (set at Iin) of each integrator is proportional to the transconductance characteristics of the Gilbert cell, i.e., gain equals gm/sC. The gm of the Gilbert cell is proportional to its tail current, which enables the resonant frequency to be varied proportionally. By feeding the nodes signals forward, summed with the proper scale factor, zeros are constructed.

It is also well known to construct a first-order filter circuit as illustrated in FIG. 1b. In this circuit, a single integrator 122 is used with its output fedback to the originating input via path 124, with a scale factor K1.

One difficulty in these designs is that, due to the long feedback paths, accumulation of stage delays and parasitics, the ability to synthesize high frequency, Hi-Q filter networks is limited.

In wideband signal filter circuits, where the signal spectrum exceeds 20 MHz, 10 Ghz or higher bipolar processes are required. Currently, there are commercially available chips (7 poles with 2 zeros) which implement Bessel type, LO-Q filters, that operate up to 13 MHz. However, each of these commercially available chips requires an excessive amount of bipolar circuitry which is costly in terms of physical chip space, manufacturing expense and reliability.

The present invention is directed to overcoming these above-referenced deficiencies in known tunable wideband signal filter circuits.

SUMMARY OF THE INVENTION

The present invention provides wideband, tunable (programmable) first and second-order filter networks which provide constant gain and normalized frequency response as the resonant frequency is varied.

In a disc-drive application, the present invention may be implemented on a single chip to provide amplification and tunable (programmable) active read-channel equalization, so as to replace semi-custom or full-custom analog signal processing chips and discrete filter networks associated with constant density recording (banding or zone-bit recording) for a magnetic disk drive. The ability to implement the present invention as a read-channel amplifier on one-chip with active filters reduces manufacturing cost, increases reliability and saves real estate for smaller disk drives, e.g., $5\frac{1}{4}$, $2\frac{1}{2}$, and 1.8" size drives. The read-channel amplifier has an increased read performance in the constant density recording disk drive where continuous optimization can be made with respect to the radial position of the read head.

According to a preferred embodiment for the second order case, the present invention is a tunable wideband active filter having a first differential input pair of transistors, with each transistor having a respective emitter which is coupled to the other emitter in the pair through a first capacitor. A positive feedback circuit feeds the differential input pair of transistors through a resistive circuit, and a control circuit is electrically coupled to the first differential input pair of transistors and provides adjustable frequency control to the active filter by varying the respective emitter currents of the first differential input pair of transistors and their respective collector loads.

The control circuit includes a multiplier circuit (of the Gilbert cell type), having a band-gap voltage of about 1.2 volts, and a post-amplifier gain circuit, arranged such that the control circuit provides a control output voltage which controls the bandwidth of the filter so as to minimize dependence of the bandwidth of the filter upon temperature. The control output voltage is coupled to the base of each transistor in the second differential pair.

BRIEF DESCRIPTION OF THE DRAWINGS

Other objects and advantages of the invention will become apparent upon reading the following detailed description and upon reference to the drawings in which:

FIG. 2b is a schematic diagram of a single-ended circuit which is equivalent to the circuit of FIG. 2a;

FIG. 2c is an equivalent block diagram of the circuit of FIG. 2a;

FIG. 3b is a schematic diagram of a single-ended circuit which is equivalent to the circuit of FIG. 3a;

FIG. 3c is an equivalent block diagram of the circuit of FIG. 3a;

FIG. 4a is a schematic diagram of a preferred embodiment of a tuning (or bandwidth control voltage) circuit, according to the present invention, which is used to tune the circuits of FIGS. 2a and 3a; and FIG. 4b is an equivalent block diagram of the circuit of FIG. 4a.

Figure 1A:
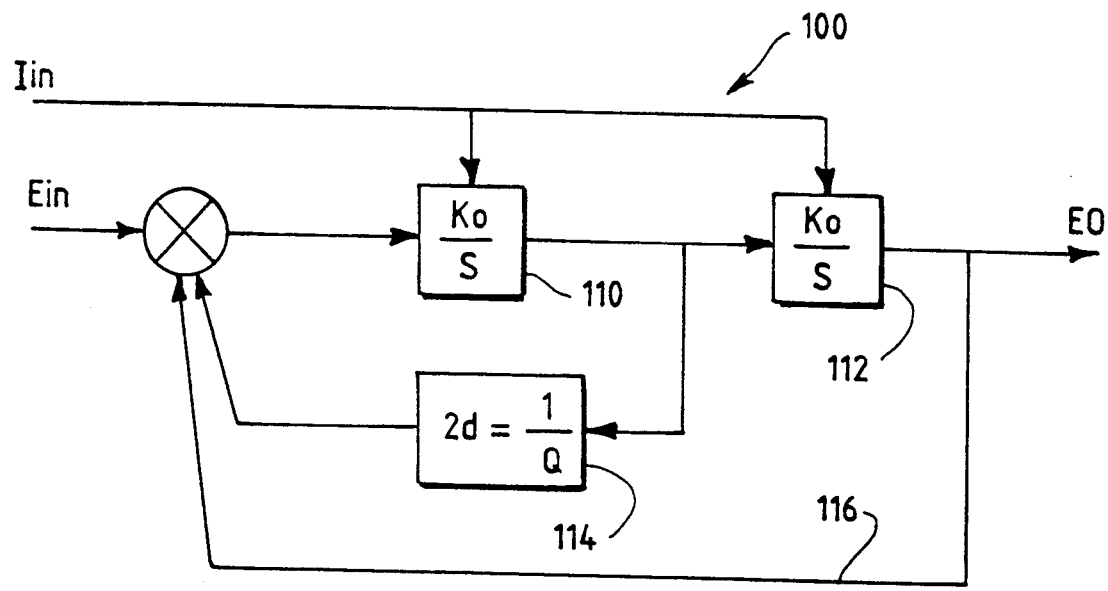
FIG. 1a is a block diagram of a second-order filter circuit according to the prior art.
Figure 1B:
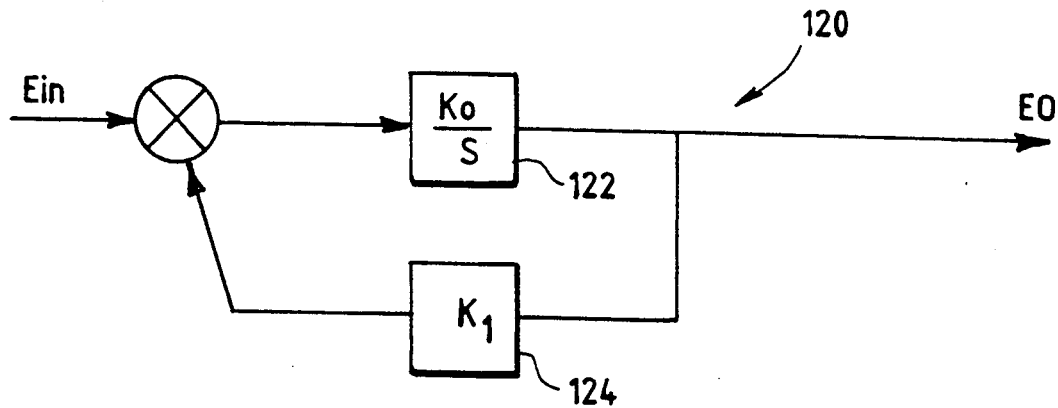
FIG. 1b is a block diagram of a first-order filter circuit according to the prior art.

While the invention is susceptible to various modifications and alternative forms, specific embodiments thereof have been shown by way of example in the drawings and will be described in detail herein. It should be understood, however, that it is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE PREFERRED EMBODIMENTS

While the present invention has a wide variety of applications, it has been found to be particularly useful in applications requiring a filtering circuit on a single integrated circuit package (typically referred to as an "IC" or "chip"). A reliable, cost-effective circuit implementation, however, requires a sufficiently-reduced component count so as to permit various groupings of the filtering circuit in order to meet the needs of the particular engineering application.

Figure 2A:
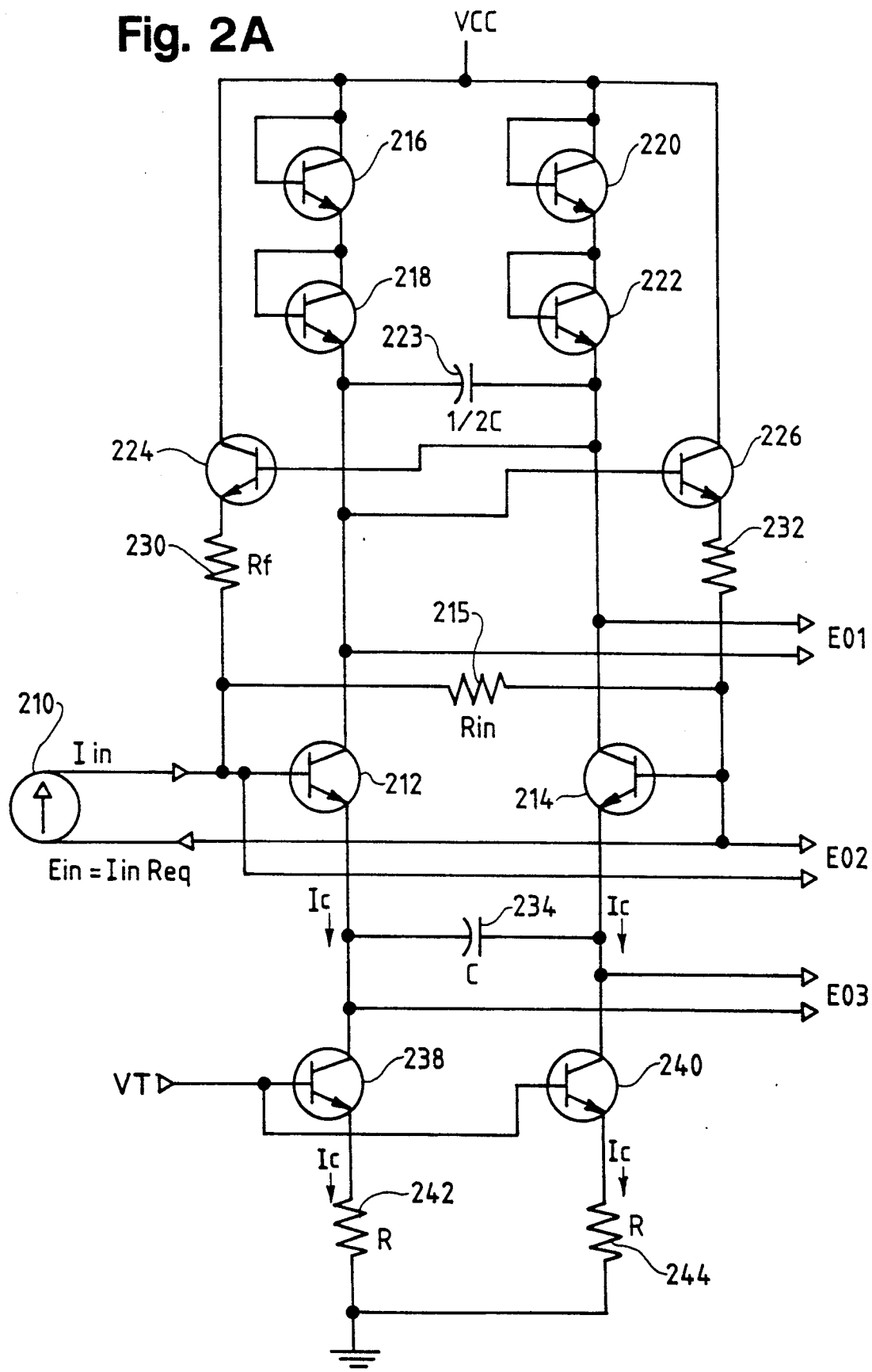
FIG. 2a is a schematic diagram of a preferred embodiment of a second-order filter circuit in accordance with the present invention.

Such a filtering circuit is illustrated in FIG. 2a. This circuit provides second-order filtering of an input 210 (Ein), with differential input transistors 212 and 214 so that the emitter resistance of each transistor 212, 214 and the collector load diodes are dependent on the associated emitter current. A resistor 215 is connected between the bases of the differential input transistors 212 and 214.

The circuit is powered via Vcc, which is connected to a set of transistors 216, 218, 220 and 222, each configured to operate as a diode, with the base connected directly to its collector to provide the collector load for the transistors 212 and 214. Additional or fewer transistors may be used in each branch for the precise collector load, as required for the desired application. Thus, the collector load of the amplifier represented by the transistors 212 and 214 is $2r_c$ shunted with C/2 to provide the same time constant ($C/2 \times 4r_c$) as its emitter circuit time constant ($C \times 2r_c$). Since the DC current, $I_c$, which passes through transistors 212, 216 and 218 is identical to the DC current that passes through the transistors 214, 220 and 222, the dynamic emitter resistance, $r_c$, has the same value for all transistors, i.e., $r_c = KT/qI_c$.

The second-order filter circuit uses positive feedback, with a loop gain of less than one, to increase the Q of the network above the value of 0.5. Feedback is provided around the transistors 212 and 214 by respective emitter follower transistors 224 and 226. Each transistor 224 or 226 has its base connected to the collector of one of the transistors 214 or 212, its collector connected to Vcc, and its emitter coupled to the base of the other of the transistors 212 or 214 via feed-back resistor 230 or 232. The combination of resistors 230 and 232 and resistor 215 provides the appropriate attenuation for the feedback signal. This resistor network also provides the appropriate input load.

The resonant frequency of this second-order filter circuit of FIG. 2a is determined by the inverse product of emitter resistance ($r_c$) of the transistors 212 and 214 and the capacitance of the on-chip capacitor 234 (C), connected between the emitters of transistors 212 and 214. The output (E01) of the second-order circuit is taken across the capacitor 223.

The set of transistors 216, 218, 220 and 222 are shunted with a capacitor 223 on the collector side of the transistors 212 and 214. The value of the shunt capacitor is one half of the emitter shunt capacitance (½ of C) to retain the same time constant as the emitter circuit time constant.

The filtering circuit of FIG. 2a provides constant gain and normalized frequency response over the total tuning range, which is set by controlling the voltage at the base of transistors 238 and 240. The base voltage of the transistors 238 and 240 is used with resistors 242 and 244 to provide a constant current source that is proportional to absolute temperature, T, so as to keep the $r_c$ temperature invariant. The circuit which provides voltage control for the base of transistors 238 and 240 is discussed in connection with the circuit of FIGS. 4a and 4b.

The circuit configuration of FIG. 2a utilizes a simple and short feedback path, which enables the filter to attain up to a 40 MHz bandwidth with a 1 Ghz process. This performance is enhanced to over 100 MHz with a 10 to 15 Ghz process.

Figure 2B:
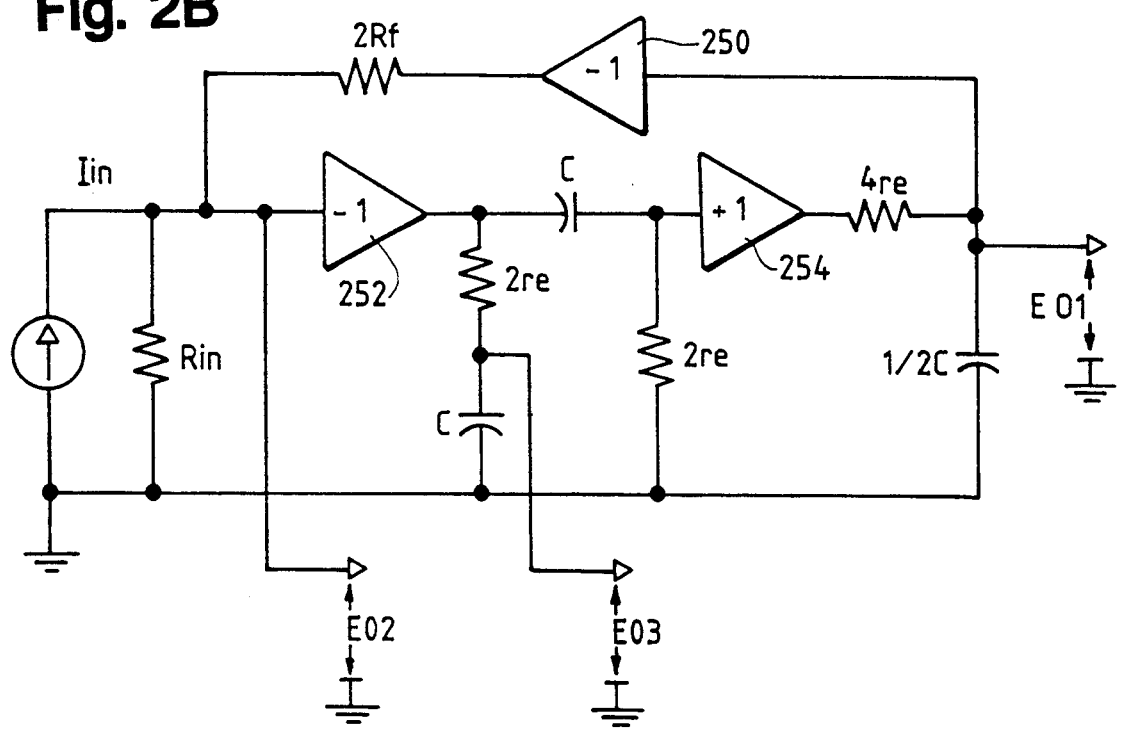

FIG. 2b illustrates the equivalent single-ended circuit for the circuit of FIG. 2a. The input signal to the circuit and the output signal of an inverting amplifier 250 in the feedback path are fed to a second inverting amplifier 252 in the forward path of the second-order filter. An amplifier 254 is configured between the output of the inverting amplifier 252 and the input of the amplifier 250. The emitter resistances ($r_c$) and the previously discussed capacitances are portrayed by their corresponding symbols from FIG. 2a.; i.e., C, $2r_c$, and $4r_c$, the emitter resistances are multiplied by a factor of 2 and of 4, respectively. The resistive attenuation of the feedback loop corresponds to A in the block diagram of FIG. 2c.

Figure 2C:
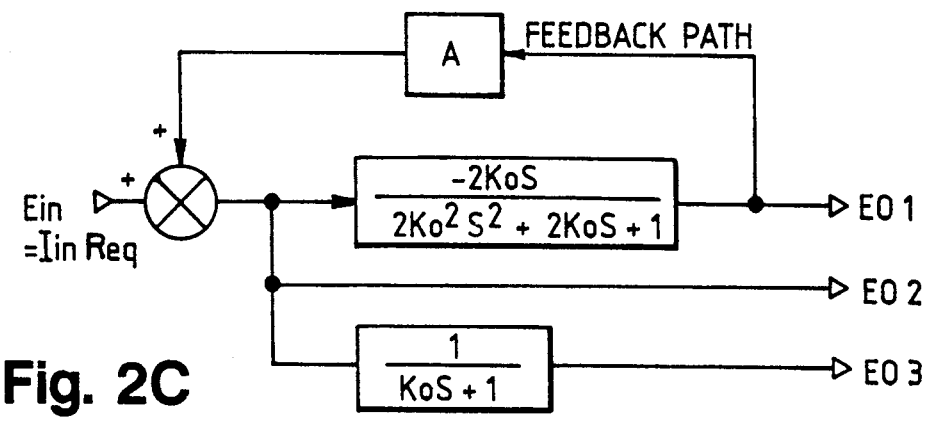

Referring now to the block diagram of FIG. 2c, the following transfer functions can be derived from these block diagrams as follows:

$$Eo1/Ein = (-2KoS)/[(KoS)^{**}2 + 2(A+1)KoS + 1] \quad (1);$$

$$Eo2/Ein = [(KoS)^{}2 + 2KoS + 1]/[(KoS)^{}2 + 2(A+1)KoS + 1] \quad (2);$$

$$Eo3/Ein = (1 + KoS)/[(KoS)^{**}2 + 2(A+1)KoS + 1] \quad (3).$$

Where $$Ko = 2re \times C(capacitor) = 2KT/(qI) \times C$$

where
K = Boltzmann constant ($1.381 \times 10e-23$)
T = absolute temperature
$q = 1.62 \times 10e - 19$ Coulomb (charge)
$A = -Rin/(2Rf + Rin)$, where $r_c < Rf$.
$2(A+1) = 1/Q$
Damping ratio $= (A+1)$
$Ein = Iin \times Rin$ For example, linearly combining equations (1), (2), and (3), the following filter networks are constructed:

second-order lowpass = (3) - 0.5(1) = 1 / $[KoS)^{**}2 + 2(A+1) + 1]$;

second-order hi-boost = (2) - 0.5(1) - (3) = $(KoS)^{}2$ / $[(KoS)^{}2 + 2(A+1)KoS + 1]$;

and second-order notch = (2) - (1) = $[(KoS)^{}2 + 1]$/ $(KoS)^{}2 + 2(A+1)KoS + 1$.

The range of the attenuator A can be varied from 0 to −1. When A=0, the feedback is zero and the Q is 0.5. When A=−1, the Q is infinite.

The positive feedback affects the coefficient, 2(A+1), of the first-order term of the denominator polynomial. Thus, Q, (1/[2(A+1)]), or damping ratio, (A+1), of the second-order filter is modifiable without affecting the resonant frequency, $1/(2pi \times Ko)$. The particular location of Ko in the transfer function ($Ko=2re \times C=2KT/(qI) \times C$) enables the filter to provide constant gain and normalized frequency response controlled by one variable, the emitter current.

Figure 3A:
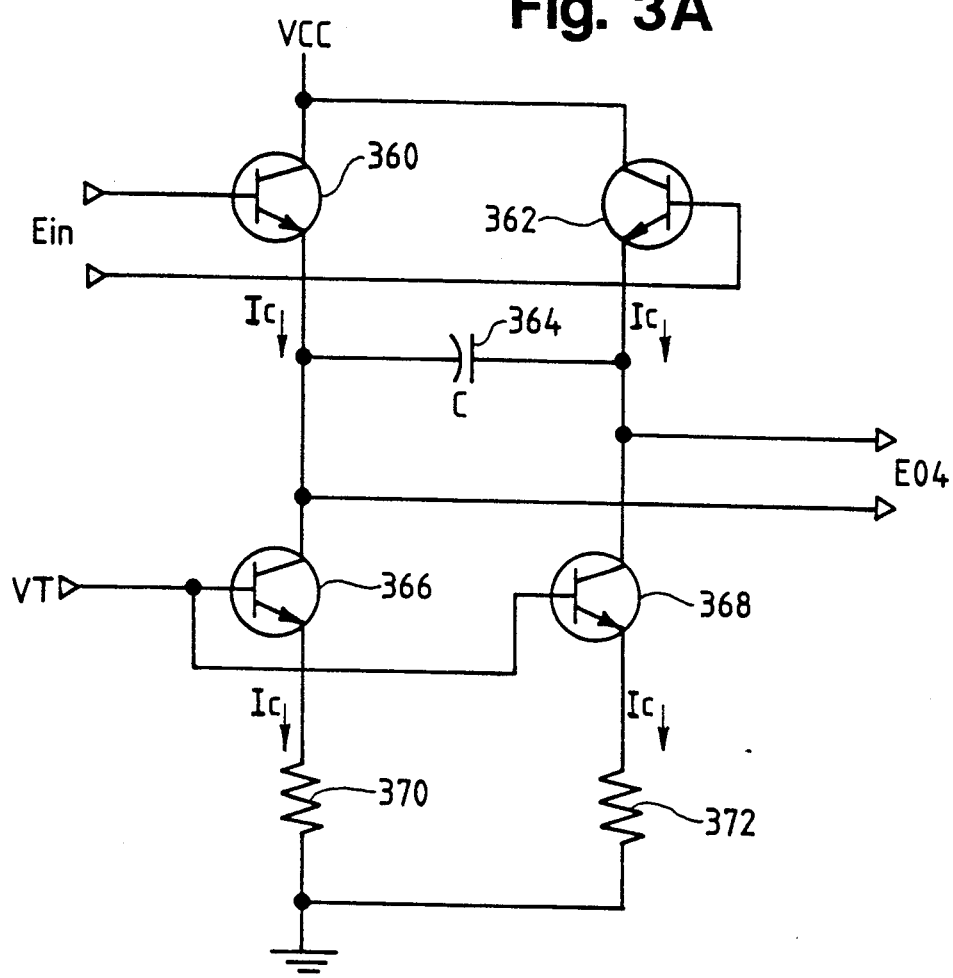
FIG. 3a is a schematic diagram of a preferred embodiment of a first-order filter circuit in accordance with the present invention.

A similarly constructed single-order filtering circuit, which is also in accordance with the present invention, is illustrated in FIG. 3a. Like the circuit in FIG. 2a, this circuit provides first-order filtering of an input Ein and includes differential input transistors 360 and 362 which are implemented so that the emitter resistance of each transistor 360 or 362 is dependent on the associated emitter current. A capacitor 364 is connected between the emitters of the differential input transistors 360 and 362.

Also similar to the circuit of FIG. 2a, this circuit provides constant gain and normalized frequency response over the total tuning range at the output (E04), which is taken across the capacitor 364. The tuning range is set in the same manner as FIG. 2a, by controlling the voltage (VT, as provided in FIG. 4A) at the base of transistors 366 and 368, with resistors 370 and 372 controlling the overall collector current through the filtering circuit.

The resonant frequency of this circuit is determined in the same manner as explained above for the second-order filter circuit of FIG. 2a.

Figure 3B:
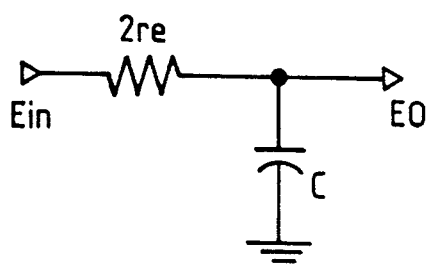
Figure 3C:
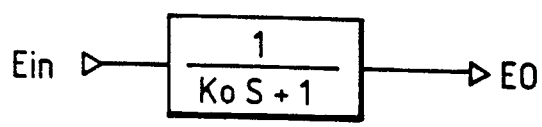

The single-ended equivalent circuit is shown in FIG. 3b. Its transfer function is as follows:

$$Eo/Ein = 1 / [(2r_e \times C)S + 1].$$

Letting $Ko = 2r_e \times C$, then $Eo/Ein = 1 / (KS+1)$. Since $r_e$, the emitter dynamic resistance of the transistors 360 and 362, is inversely proportional to the current through the emitter of the transistors 366 and 368, the time constant of the first-order low pass filter (Ko) provides the cut-off frequency (the 3 dB frequency 1/Ko in radians per second) and is varied inversely proportional to its emitter current per the following equation:

$$r_e = K \times T / q \times Ic,$$

where Ic is the DC emitter current of transistors 360 and 362 in amps.

Figure 4A:
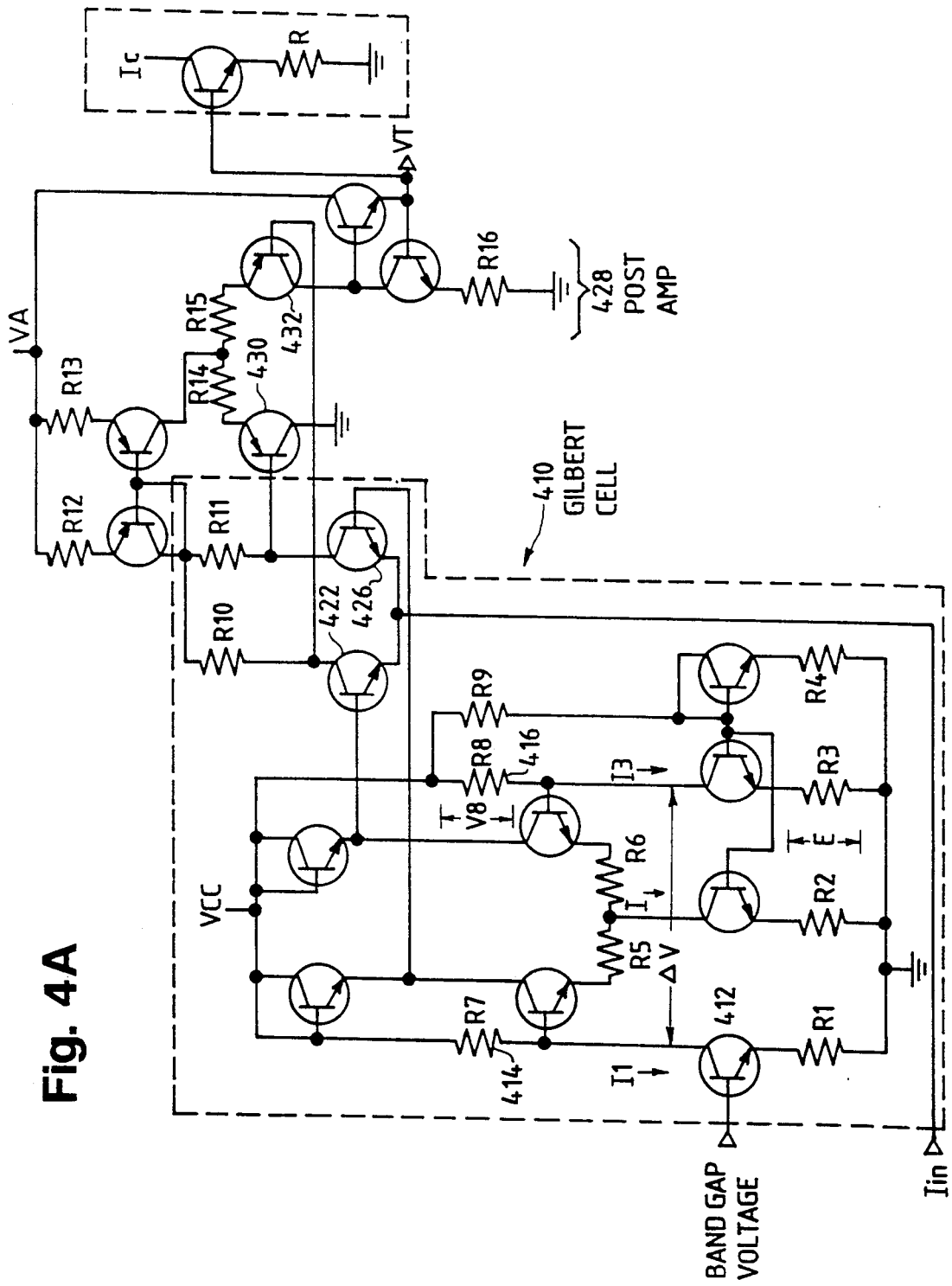
Figure 4B:
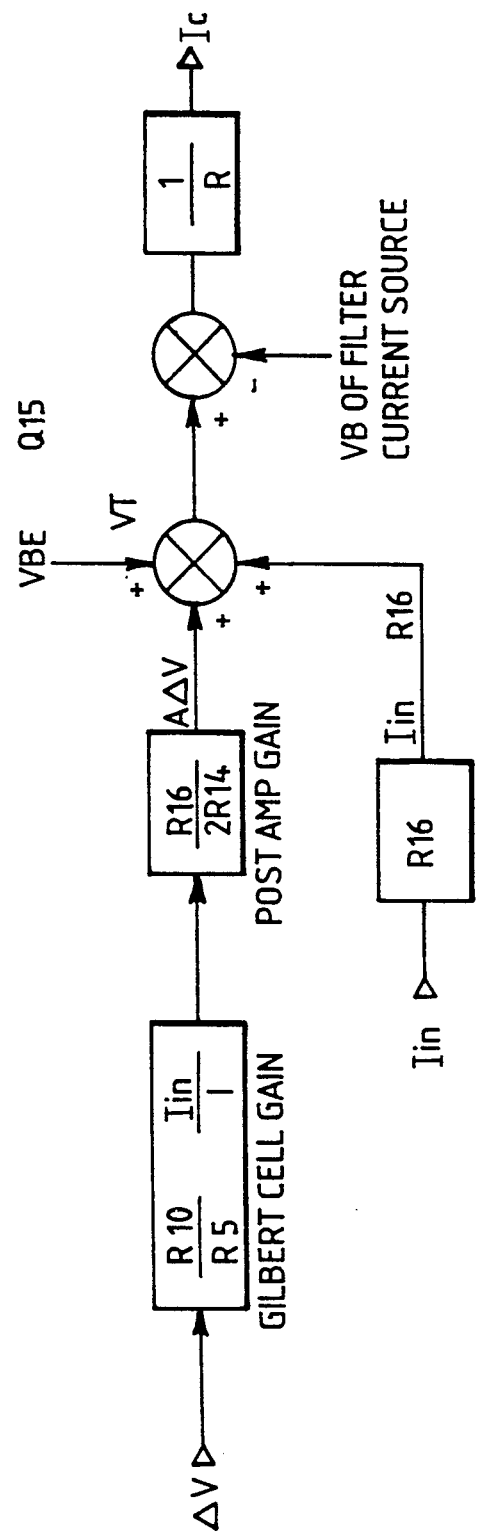

Referring now to FIG. 4a, the bandwidth control aspect of the filtering circuitry is illustrated. As discussed above, the dynamic resistance of the transistor emitter varies inversely proportional with the bias current, as given in the equation $r_e = K \times T / q \times I$.

In order to keep the bandwidth of the filter networks temperature invariant, current through the emitter is increased proportionally to the temperature term of the equation KT/(qI), i.e., proportional to T because the frequency is determined by the elements $r_e \times C$. The circuit shown in FIG. 4a provides tuning voltage to the first and second-order filter network, with a temperature invariant bias voltage, approximately 1.2 volts (bandgap voltage), at the base of transistor 412, which is the input to the Gilbert cell (multiplier) 410 (shown in dashed lines). Because I1 of transistor 412 will increase with temperature (due to the emitter-base voltage change due to temperature), the voltage across resistor 414 will vary with temperature.

This voltage is compared with the voltage across resistor 416, which is a temperature independent voltage. The difference between these voltages is the temperature dependent portion of the voltage across resistor 414 (delta V). The delta V is then amplified by the Gilbert Cell, whose gain is proportional to Iin injected to the emitters of transistors 422 and 426 and further amplified by the post-amplifier 428, which includes transistors 430 and 432. The gain of the multiplier is proportional to Iin, which is mirrored to the output, producing voltage of Ro×Iin. Therefore, the tuning voltage VT becomes:

$$VT = A \times delta \ V + Iin \times R16 + VbeQ15,$$

and $$Ic = 1/R \times (Vt - Vbe);$$

since VbeQ15=Vbe (of the filter tuning current source). Therefore:

$$Ic = (A \times delta \ V + Iin \times R16)(1/R).$$

Substituting for A, (R10/R5)×(Iin/I)×R16/2R14), then $$Ic = Iin \times \{[temperature \ variant \ portion] + [temperature \ invariant \ portion]\}.$$

where the temperature variant portion=delta V×(R2/E)×(R10/R5)×(R16/2R14)×(1/R), and the temperature invariant portion=R16/R, and where I=E / R2.

To determine the gain of the amplifier and post amplifier, the ratio of the temperature variant portion and the temperature invariant portion must=(delta V) / V8.

While the present invention has been particularly shown and described with reference to certain embodiments, those skilled in the art it will recognize that various modifications and changes may be made. For example, although the present invention has been shown using NPN transistors, it will be understood that a equivalent circuit can be implemented using PNP, and even FET-type transistors. Such changes do not depart from the spirit and scope of the present invention.

What is claimed is:

1. A tunable wideband active filter, comprising:
 a differential input pair of transistors, each of said transistors having an emitter, said emitters being coupled together through a first capacitor for propagating respective emitter currents;
 a positive feedback circuit feeding said differential input pair of transistors through a resistive circuit; and
 a control circuit coupled to said differential input pair of transistors for providing adjustable frequency control for the active filter by varying the respective emitter currents of said differential input pair of transistors.

2. A tunable wideband active filter, according to claim 1, wherein said resistive circuit includes a first end and a second end, said first end being coupled to a base of one of said differential input pair of transistors.

3. A tunable wideband active filter, according to claim 2, wherein said differential input pair of transistors is coupled to Vcc, said second end of said resistive circuit is coupled to said differential input pair of transistors, and said differential input pair of transistors provides a first-level output.

4. A tunable wideband active filter, according to claim 1, wherein said resistive circuit has a first resistive path coupled from a base of one of said transistors to the other of said transistors, and a second resistive path coupled from a base of said other of said transistors to said one of said transistors.

5. A tunable wideband active filter circuit having a filter circuit Q, the filter circuit comprising:
  a first differential input pair of NPN transistors, said transistors having respective emitters coupled together through a first capacitor and which propagate respective emitter currents;
  a resistive circuit coupled to said first differential input pair of NPN transistors and having a resistive value for establishing the filter circuit Q;
  a positive feedback circuit for feeding said differential input pair of transistors through said resistive circuit; and
  a control circuit coupled to said first differential input pair of transistors for providing adjustable frequency control to the active filter.

6. A tunable wideband active filter, according to claim 5, wherein said resistive circuit includes a first resistive path coupled between a base of one of said transistors and a collector of the other of said transistors, and a second resistive path coupled between a base of said other of said transistors and a collector of said one of said transistors.

7. A tunable wideband active filter, according to claim 6, wherein each of said first and second resistive paths comprise amplification means in series with a resistor.

8. A tunable wideband active filter, according to claim 7, wherein the collector of each of said transistors is coupled to Vcc through at least one transistor configured as a diode.

9. A tunable wideband active filter, according to claim 8, further comprising a second pair of transistors, each of which has a base at least partially driven by said control circuit and having an emitter coupling current from said first differential input pair of transistors to ground.

10. A tunable wideband active filter, according to claim 7, further comprising a second pair of transistors, each of which has a base at least partially driven by said control circuit and having an emitter coupling current from said first differential input pair of transistors to ground.

11. A tunable wideband active filter, comprising:
  a first-order filter circuit and a second-order filter circuit, each of said filter circuits comprising a respective differential input pair of transistors, said transistors having respective emitters which are coupled together through a first capacitor and which propagate respective emitter currents; said second-order filter circuit having a positive feedback circuit for feeding said differential input pair of transistors said second-order filter circuit through a resistive circuit, and a control circuit coupled to both of said differential input pair of transistors of said first-order filter circuit and said differential input pair of transistors for said second-order filter circuit for providing adjustable frequency control for the active filter by varying the respective emitter currents of said differential input pair of transistors of said first and second-order filter circuits.

12. A tunable wideband active filter, according to claim 11, wherein said second order filter circuit further comprises a third pair of transistors, each configured as a diode and each coupled between Vcc and said first differential input pair of transistors of said second-order filter circuit.

13. A tunable wideband active filter, according to claim 11, wherein each of said first differential input pair of transistors of said first order filter circuit has an emitter resistance, a collector current and an absolute temperature, and wherein the collector current varies proportionally to the absolute temperature.

14. A tunable wideband active filter, according to claim 13, wherein at least one of the following transfer functions can be derived therefrom:

$$Eo1Ein = (-2KoS)/[(KoS)**2 + 2(A+1)KoS + 1] \quad (2);$$

$$Eo2/Ein = [(KoS)2 + 2KoS + 1]/[(KoS)2 + 2(A+1)KoS + 1] \quad (2);$$

$$Eo3Ein = (1+KoS)/[(KoS)**2 + 2(A+1)KoS + 1] \quad (3);$$

where $Ko = 2re \times C(capacitor) = 2KT/(qI) \times C$, $K = 1.381 \times 10e-23$, $T =$ absolute temperature, $q = 1.62 \times 10e-19$ Coulomb (charge), A is a constant derived, $2(A+1) = 1/Q$. Ein is an input signal, and Eo1, Eo2 and Eo3 are filter output signals coupled to said differential input pair of transistors of said second-order filter.

15. A tunable wideband active filter, as set forth in claim 11, wherein said positive feedback circuit has a loop gain of less than one for providing a network Q which is above 0.5.

16. A tunable wideband active filter, comprising:
  a first differential input pair of transistors, said transistors having respective emitters, coupled together through a first capacitor, for propagating respective emitter currents and having respective collectors coupled together through a second capacitor;
  a positive feedback circuit for feeding said differential input pair of transistors through a resistive circuit; and
  a control circuit coupled to said first differential input pair of transistors, providing adjustable frequency control to the active filter by varying the respective emitter currents of the first differential input pair of transistors.

17. A tunable wideband active filter, as set forth in claim 16, wherein said control circuit includes a multiplier circuit and a post-amplifier gain circuit.

18. A tunable wideband active filter, as set forth in claim 17, wherein said multiplier circuit includes a Gilbert-type cell having a band-gap voltage of about 1.2 volts.

19. A tunable wideband active filter, as set forth in claim 17, wherein said control circuit provides a control output voltage for controlling the resonant frequency of the filter so as to minimize dependence of the bandwidth of the filter upon temperature.

20. A tunable wideband active filter, according to claim 11, further comprising a first pair of transistors, each of which has a base at least partially driven by said control circuit and having an emitter coupling current from said differential input pair of transistors of said first-order filter; and
  a second pair of transistors, each of which has a base at least partially driven by said control circuit and having an emitter coupling current from said differential input pair of transistors of said second-order filter.

* * * * *